United States Patent [19]

Cotte et al.

[11] Patent Number: 5,800,726
[45] Date of Patent: Sep. 1, 1998

[54] SELECTIVE CHEMICAL ETCHING IN MICROELECTRONICS FABRICATION

[75] Inventors: John Michael Cotte, New Fairfield, Conn.; Madhav Datta, Yorktown Heights, N.Y.; Thomas Edward Dinan, Poughkeepsie, N.Y.; Ravindra Vaman Shenoy, Peekskill, N.Y.

[73] Assignee: International Business Machines Corporation, Armonk, N.Y.

[21] Appl. No.: 507,098

[22] Filed: Jul. 26, 1995

[51] Int. Cl.$^6$ .................................................. C23G 001/14
[52] U.S. Cl. .......................... 216/108; 216/103; 216/106; 156/656.1; 252/79.1
[58] Field of Search .................... 252/79.1; 216/90, 216/106, 100, 108, 103; 156/656.1

[56] References Cited

U.S. PATENT DOCUMENTS

| | | | |
|---|---|---|---|
| 4,404,059 | 9/1983 | Livshits et al. | 156/629 |
| 4,491,500 | 1/1985 | Michaud et al. | 156/628 |
| 4,554,050 | 11/1985 | Minford et al. | 156/664 |
| 4,671,852 | 6/1987 | Pyke | 156/652 |
| 4,705,594 | 11/1987 | Zobbi et al. | 156/637 |
| 4,814,293 | 3/1989 | Van Oekel | 437/192 |
| 5,041,191 | 8/1991 | Watson | 156/652 |
| 5,130,275 | 7/1992 | Dion | 437/225 |

FOREIGN PATENT DOCUMENTS

| | | |
|---|---|---|
| 50-030754 | 3/1975 | Japan . |
| 59-121954 | 7/1984 | Japan . |
| 60-056077 | 4/1985 | Japan . |

*Primary Examiner*—R. Bruce Breneman
*Assistant Examiner*—George Goudreau
*Attorney, Agent, or Firm*—Stephen S. Strunck

[57] ABSTRACT

The present invention relates to a chemical etchant for etching metals in the presence of one or more metals not to be etched, the etchant comprising 10–25 gms EDTA, 15–35 gms $K_2HPO_4$ and 25–45 gms oxalic acid in a liter of 30% $H_2O_2$. More particularly, in the fabrication of interconnections for microchip structures, the present invention addresses the removal of intermediate adherent layers, e.g., Ti—W, without damaging other microchip structures made of other metals, such as Al or Al—Cu test pads; Cu and phased Cr—Cu layers; and Sn—Pb solder bumps. The use of potassium phosphate in the hydrogen peroxide+EDTA bath has been found to significantly reduce the attack on the metal not to be etched. Furthermore, the use of oxalic acid in the bath prevented the deposition of tin oxide on the substrate adherent layer metal, thus facilitating its complete removal.

11 Claims, 4 Drawing Sheets

SELECTIVE CHEMICAL ETCHING IN MICROELECTRONICS FABRICATION

BACKGROUND OF THE INVENTION

1. Field of the Invention

The present invention relates to the selective etching of metals, especially in microelectronics fabrication.

2. Description of the Related Art

C4 is an advanced microelectronic chip packaging and connection technology. "C4" stands for Controlled Collapse Chip Connection. C4 is also known as "solder bump", "solder balls" and "flip chip".

The basic idea of C4 is to connect chips, chip packages, or such other units by means of solder bumps partially crushed between two surfaces of the units. These tiny bumps of electrically conductive solder bridge the gaps between respective pairs of metal pads on the units being connected. Each pad has a corresponding pad on the other unit's surface; the pad arrangements are mirror images. As the units are pressed together the solder bumps on the pads of the first unit are pressed against corresponding conductive pads (having no bumps) on the second unit, partially collapsing the solder bumps and making connections between respective pads.

In C4 the solder bumps are formed directly on the metal pads of the one unit. The pads are electrically isolated from other components by the insulating substrate that surrounds each pad. The substrate might be un-doped silicon (Si) or some other material. The bottom of the pad is electrically connected into the chip circuit.

When the two surfaces are aligned and then pushed together, the soft solder bumps are partially crushed. This allows all the connections to be made in one step, in spite of slight variations in the surfaces.

A major application of C4 is in joining semiconductor microchips (integrated circuits) to chip packages. Chips usually are made in rectangular arrays on a mono-crystalline slab of silicon, called a "wafer," which is a thin disc several inches across. Many chips are formed on each wafer, and then the wafer is broken up into individual chips and the chips are "packaged" in units large enough to be handled. The C4 bumps are placed on the chips while they are still joined in a wafer.

The wafers are made as large as possible so as to reduce the number wafers that must be processed to make a certain number of chips. For the same reason (among others) the chips are made as small as possible. Thus, the best C4 fabrication system is one that can make thousands of very small, closely-spaced solder bumps each precisely placed over a large area.

C4 allows a very high density of electrical interconnections. Unlike earlier techniques which made connections around the perimeter of a chip or a chip package, C4 allows one or more surfaces of a chip or package to be placed with pads. The number of possible connections with C4 is roughly the square of the number that is possible with a perimeter connection. Since the C4 bumps can be made quite small, about a hundredth of an inch in diameter, the surface density of C4 connections can be on the order of thousands per square inch.

Electrical engineers are constantly placing more and more circuits onto each chip, to improve performance and reduce cost. As the number of circuits on a chip grows, so does the number of connections needed. C4, which allows more connections in a small space than any other technique, is thus commercially important.

Besides making possible area connections, C4 can also be used with perimeter connection techniques such as tape automated bonding (TAB), in which solder bumps on a chip are pressed against a pattern of metal foil adhered on a plastic substrate of the chip package. These applications, too, are commercially important.

C4 solder bumps must be mechanically well-fastened to their pads, or they may be torn off when the two surfaces are pushed together. It will be appreciated that a complex device such as a computer may have dozens of chips and hundreds or thousands of C4 solder ball connections, and the entire device may be rendered useless if only one of the bumps fails. The attachment of the C4 bumps requires careful design.

One method of forming solder bumps uses sputtering or vacuum deposition. Solder metal is evaporated in a vacuum chamber. The metal vapor coats everything in the chamber with a thin film of the evaporated metal. To form solder bumps on the substrate, the vapor is allowed pass through holes in a metal mask held over the substrate. The solder vapor passing through the holes condenses onto the cool surface into rounded solder bumps. This method requires a high vacuum chamber to hold the substrate, mask, and flash evaporator.

The mask is specially made with high-precision holes, or "vias," for locating the solder bumps. The mask will be heated as hot metal vapor released into the vacuum chamber condenses on it. To avoid misalignment of the vias due to thermal expansion, the masks may be made of special metals, and even so the size of the mask is limited. Thus, this method cannot be used for large wafers containing many chips.

An alternative technique for making solder bumps is electrodeposition, also called electrochemical plating or electroplating. This method also uses a mask and forms solder bumps only at the selected sites, but the technique is very different from the evaporation method.

Solder bump electrodeposition requires a first preliminary step, the creation of a continuous "seed layer" of conductive metal adhered onto the insulating substrate. The seed layer is needed to conduct the electricity which deposits solder.

FIG. 1A, labelled "prior art," shows a wafer substrate S whose surface is overlaid with a conductive layer L1 of chromium (Cr). This metal layer, which will function as part of the seed layer for electrodepositing solder bumps, might be a ten-thousandth of a millimeter thick. On top of the Cr is deposited a thin "phased" layer L2 of 50% chromium-50% copper (Cr—Cu). Finally, a third layer L3 of pure copper is deposited over all of the wafer. The Cr, Cr—Cu, and Cu layers are of comparable thicknesses. (FIG. 1A shows atop the seed layers L1-L3 a solder bump B and mask M, which are added in later steps. The first step of coating the substrate S is done on a bare substrate surface.)

The second preliminary step, after the seed layer is laid down, is to form a mask by photolithography. A layer of photoresist is laid onto the seed layer and exposed to light. Unexposed photoresist can then be washed away to leave the cured photoresist behind as a mask. Cured photoresist is shown in FIG. 1A as part of the mask M.

When the exposed photoresist has been cured and the uncured photoresist has been removed, the mask is complete. The mask has rows of holes where the solder bumps are to be deposited.

The third step is electrodeposition (electroplating) of lead alloy into the mask holes. An electrodeposited solder bump B is shown in FIG. 1A. The solder bump B might be ¼ millimeter thick; the thickness of the seed layers L1–L3 is exaggerated in FIG. 1A for clarity.

Solder bump B contains tin (Sn) and so will adhere well to the uppermost copper layer. The two metals react to form an "intermetallic," $Cu_xSn_y$ (for example, $Cu_3Sn$). The phased Cr—Cu layer L2 holds the Cr and Cu layers together, and the Cr sticks well to the wafer.

After the solder bumps are formed, the mask of cured photoresist is removed. The substrate now is covered with the continuous seed layer and numerous solder bumps.

After the seed layer is deposited over the substrate and the C4 bumps have been formed, the seed layer is desirably removed in between the solder bumps to electrically isolate them. The removal can be done by chemical etching or by electroetching.

FIG. 1B shows the seed layers removed to leave the solder bumps electrically isolated but mechanically fixed to the substrate. This is accomplished by etching the layers L1–L3 away with chemical or electrolytic action; in either case the solder bump B protects the layers under it. FIG. 1C shows a solder ball B formed by melting, or reflowing, the solder ball B of FIGS. 1A–1B. The solder ball is now ready to make contact.

Alloys of titanium (Ti) and tungsten (W) have been used in the prior art as "barrier" layers to protect chip parts during certain processes. Ti—W is metallic and will conduct electricity. A thin film of Ti—W can be applied by conventional microelectronic techniques like sputtering.

If Ti—W is used, it may be desirable to remove the Ti—W at some stage of fabrication. Several inventors have addressed the problem of removing Ti—W.

John Dion, in U.S. Pat. No. 5,130,275, teaches post-fabrication processing of semiconductor chips. His method is intended for solder joining of chips to TAB packages, where the solder is flowed rather than crushed to make the connection. Dion employs a barrier metal layer, of 10% Ti and 90% W by weight, coated over Al or gold (Au) interconnect pads 14 and a passivating layer of $SiO_2$. A Cu or Au seed layer is coated over the barrier layer. The thickness of metal over the pads is increased by electrodeposition of Cu or Au bumps into holes in a photoresist mask. Solder containing Sn is then deposited on top of the Cu or Au, and then first the seed layer and then the barrier layer are etched away to leave the built-up pads ready for soldering.

The seed layer, if of gold, is removed by chemical etching in 10% potassium cyanide. This etchant attacks the bump as well, but Dion accepts the resulting bump damage as minimal, since the bump is 25 microns thick whereas the seed layer is only 0.3 microns thick.

Dion next etches the Ti—W barrier in an aqueous solution of 30% hydrogen peroxide. (Hydrogen peroxide, or $H_2O_2$, is commercially available in 30% concentration.) He notes (column 8, line 37) that peroxide can corrode the solder bead atop the Cu/Au bump. He teaches prevention of corrosion by adjusting the pH of the solution to between 9 and 11 (basic). His preferred solution is 7% oxidized ammonium persulfate and 1% to 2% hydrogen peroxide, with the pH adjusted to between 9 and 11 by adding ammonium hydroxide. However, Dion's etchants will attack aluminum.

A 10% Ti-90% W barrier layer is also taught by James Watson in U.S. Pat. No. 5,041,191. Watson uses the Ti—W layer to prevent undesirable intermetallics that form when Au, Cu or Al contacts are deposited directly onto a thin-film resistor of nickel-chromium alloy. Watson's Ti—W etchant is 5 g of cupric sulfate ($CUSO_4$), 10 ml ammonium hydroxide ($NH_4OH$), 100 ml glycerol, and 125 ml deionized water.

This solution does not affect the nickel chromium, according to Watson. Like Dion's however, Watson's solution is alkaline and will attack aluminum.

Stephen Pyke, in U.S. Pat. No. 4,671,852, teaches an etchant composed of hydrogen peroxide, EDTA, and ammonium hydroxide for removing a thin (0.05–0.10 microns) film of 10%–30% by weight Ti and 90%–60% by weight W. Pyke's device is a chemically-sensitive SGFET structure with an internal cavity. Etchant is introduced into the cavity, which also contains a noble metal (platinum) and an aluminum oxide or silicon oxide "fugitive" layer. The etchant is intended to selectively etch the Ti—W film.

Pyke's etchant is 0.1 molar EDTA, 30% hydrogen peroxide, and concentrated ammonium hydroxide mixed in a respective volume ratio of 10:3:2. Pyke states that the pH should be less than 11 (not too basic). Pyke also teaches the use of other complexing agents besides EDTA, such as carboxylates, bipyridines, etc., but he gives no formulas or other details.

Pyke's invention, too, will attack aluminum.

U.S. Pat. No. 4,814,293, issued to Jacques Van Oekel, also teaches chemical etching of 10% Ti-90% W. He notes that hydrogen peroxide causes inhomogeneous etching, and in particular the undercutting or underetching, when Ti—W films are layered between other metals, is irregular. The agitation commonly used is ineffective in reducing the uneven results, and he advocates stagnant liquid etchants. Van Oekel buffers the peroxide solution to a pH value between 1 and 6 (acidic). His preferred buffering compounds are acetic acid and ammonium acetate. He also uses citric acid and sodium hydroxide. The etch rate is varied with the pH.

Van Oekell's solution will severely attack lead-tin (Pb—Sn) alloys such as solder, and this patent does not address selective etching of Ti—W in the presence of PbSn.

Minford et al., in U.S. Pat. No. 4,554,050 teach the use of Ti etchants in fabricating waveguides. Their etchant is composed of EDTA, water, hydrogen peroxide, and ammonium hydroxide. One formula they present is 2.5 g of disodium EDTA in 100 ml of deionized water (a 0.067M solution) with 10 g hydrogen peroxide and 4.2 g ammonium hydroxide. The pH is about 10.

The etch rate is controlled by varying the OH concentration and the temperature. Minford et al. tested their solution at 20° C. (room temperature) and at 60° C.

Minford et al. states that their solution will etch aluminum. Moreover, their solution will attach Pb—Sn as well as aluminum.

In U.S. Pat. Ser. No. 08/346,996 (which is incorporated herein by reference) there is disclosed an invention related to a chemical etching process for removal of TiW layer in the fabrication of 97Pb3Sn C4s. The etching bath contains hydrogen peroxide as the etchant, potassium sulfate to form a protective coating on Pb, and EDTA to form metallic complexes. The process operates at 55° C. and is extremely selective, i.e., does not attack the 97Pb3Sn C4s and the other exposed layers.

In many applications, low strength solders are acceptable and even desirable as their melting temperatures tend to be lower than high strength, high lead solders. Eutectic solders (60% Sn–40% Pb) are one such solder having especially the low melting point associated with the eutectic alloy.

While the eutectic solder has many advantages, it also has problems not the least of which is that the etching solution of the above-described U.S. Pat. Ser. No. 08/260,049 could not be used since it: (i) significantly attacked the Sn rich phase of the eutectic C4s and (ii) lead to deposition of tin oxide on TiW layer which eventually prevented TiW etching.

SUMMARY OF THE INVENTION

Accordingly, the present invention relates to a chemical etchant for etching metals (and/or alloys) in the presence of one or more metals (and/or alloys) not to be etched, the etchant comprising 10–25 gms EDTA, 15–35 gms $K_2HPO_4$ and 25–45 gms oxalic acid in a liter of 30% $H_2O_2$. More particularly, in the fabrication of interconnections for microchip structures, the present invention addresses the removal of intermediate adherent layers, e.g., Ti—W, without damaging other exposed layers that form the interconnections structures, such as Al or Al—Cu test pads; Cu and phased Cr—Cu layers; and Sn—Pb solder bumps. The use of potassium phosphate in the hydrogen peroxide+EDTA bath has been found to significantly reduce the attack on the metal not to be etched. Furthermore, the use of oxalic acid in the bath prevented the deposition of tin oxide on the substrate adherent layer metal, thus facilitating its complete removal.

DETAILED DESCRIPTION OF THE INVENTION

Figure 1A:
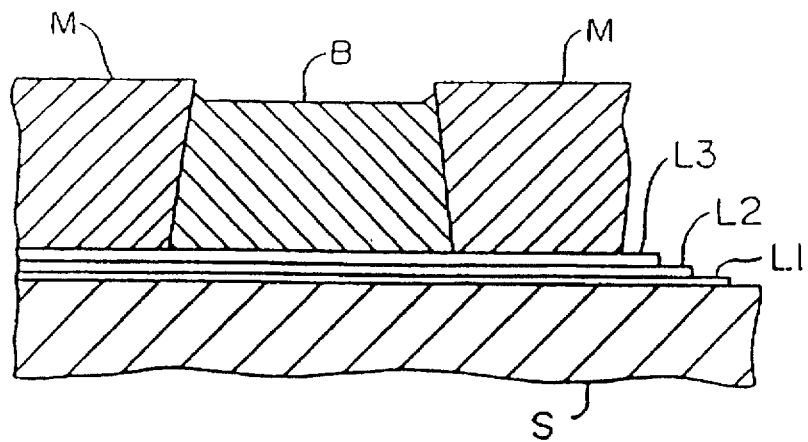
FIGS. 1A–1C are elevational, cross-sectional views of C4 solder ball formation by electroplating in accordance with the prior art.

The present invention relates to a method for selectively etching (dissolving) metals and/or alloys in the presence of one or more metals and/or alloys not to be dissolved, e.g., Al, Al—Cu, Cu, Cr—Cu, phased Cr—Cu, Pb, Sn and Sn—Pb, and to a chemical etchant used in the selective etching process. More specifically, the etchant (and its corresponding method) was developed for C4 fabrication using electrodeposition of eutectic Sn—Pb solder bumps onto a continuous metal seed layer with a Ti—W substrate adherent layer, phased Cr—Cu layer on top of the Ti—W, and Cu as a top layer.

Aluminum is often used for "test" pads, pads similar to C4 pads but intended only for temporary contact with test probes when the chips are examined for defects. Copper adheres well to the tin/lead solder-ball alloy used in the invention, which might be a mixture of 60% Sn with 40% Pb. When the solder bumps are reflowed (melted) into solder bumps, the tin of the solder and the copper of the seed layer form an intermetallic, $Cu_xSn_y$, under the high temperature of reflowing.

The adherence of pure copper to a silicon substrate is not strong enough for mechanical reliability of C4 bumps on a copper seed layer. Experiments with phased Cr—Cu (resulting from the simultaneous sputtering of Cr and Cu) showed that the Cr adhered well to the substrates and also could be selectively etched. Thus, the first seed layer could be formed of phased Cr—Cu and the second of pure Cu. This seed layer structure was found to be strong, as the Cr—Cu adhered to the substrate and to the Cu and the Cu adhered well to the Pb—Sn of the solder bump. The Cu and Cr—Cu could be selectively etched for greater design freedom.

In the prior art chromium has been used as the bottom seed layer, as it adheres well to many substrates. In regard to the present invention it was found that available selective Cr etchants attack Al test sites. Furthermore, it is possible that the Cr etchant used could seep into the chip through pinholes and damage the internal structure. To solve the problem an underlying coating of Ti—W barrier metal composed of 10% titanium (Ti) and 90% tungsten (W) was applied to the substrate as a preliminary seed layer. It was found that Ti—W adheres well to substrate material when sputter-deposited in a vacuum chamber.

Since Ti—W adheres well to both the substrate and Cr—Cu, it can act as both a barrier layer and as part of the seed layer. Ti—W as a barrier/seed layer thus allows greater freedom in selectively etching Cr—Cu and Cu.

However, the Ti—W must eventually be removed if it is part of the seed layer, since it is conductive and would short out the solder bumps. For the Ti—W film to be useful it must be possible to selectively dissolve it without damaging structures made of other metals, such as Al or Al—Cu test pads; Cu and phased Cr—Cu layers; and Sn—Pb solder bumps.

The present invention particularly addresses the removal of Ti—W without damage to microchip structures of Sn—Pb, Al, Al—Cr, Cu, and Cr—Cu.

Figure 2:
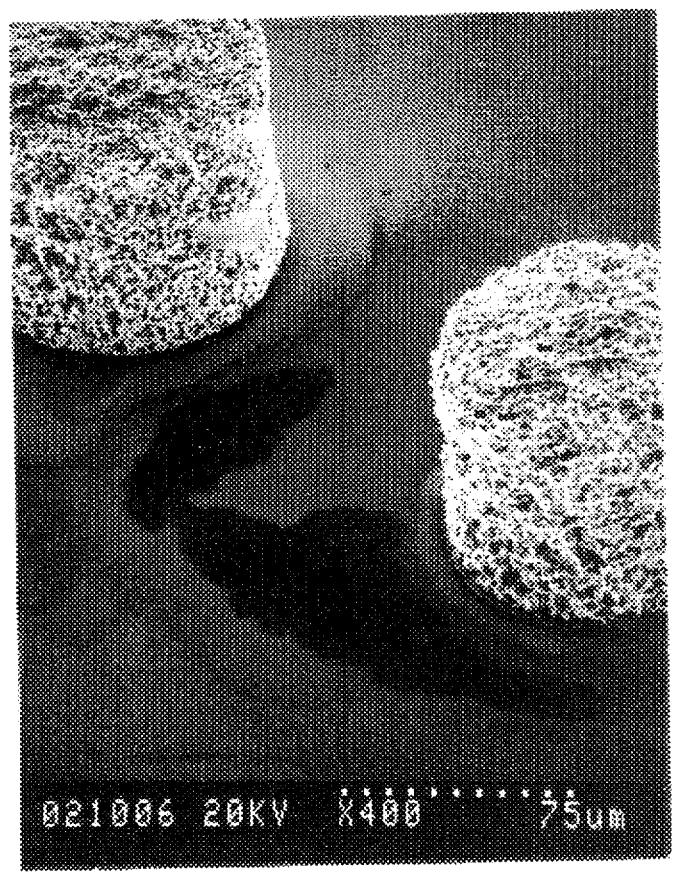
FIG. 2 is a SEM photograph of eutectic C4 solder bumps after etching with a TiW etching bath used in the fabrication of 97Pb/3Pb C4s.
Figure 3:
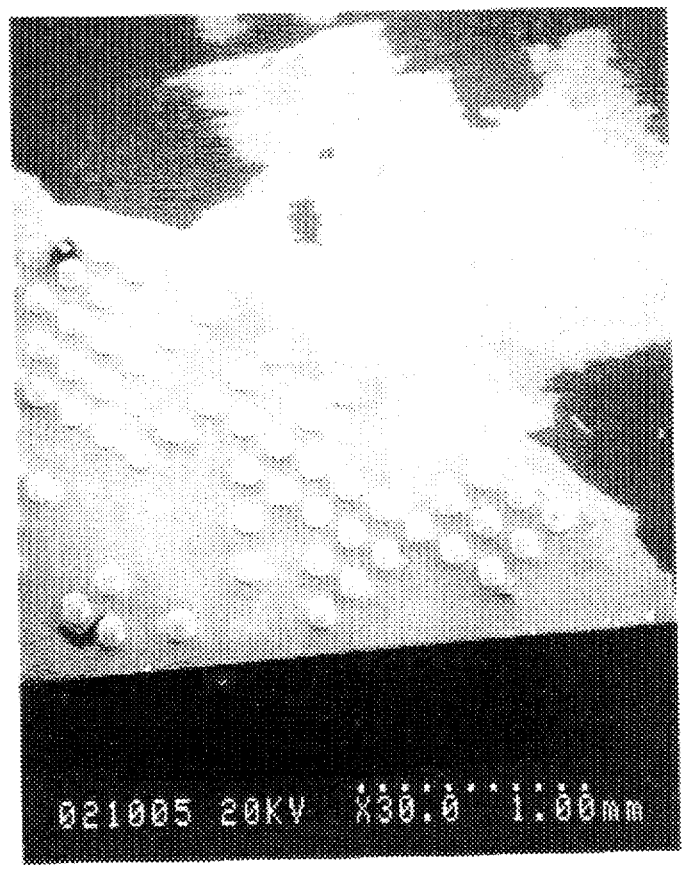
FIG. 3 is a SEM photograph showing patches of TiW layer remaining after prolonged etching with the TiW etching bath of FIG. 2.

While the electroetching process of U.S. Pat. Ser. No. 08/346,996 developed for 97Pb/3Sn C4s is also applicable to eutectic C4s, the TiW etching bath itself led to severe attack of the Sn phase as evidenced by a highly porous structure of the eutectic C4s as shown in FIG. 2. Furthermore, patches of TiW layer remained in between C4s as shown in FIG. 3. Continued etching did not remove the TiW layer any further but lead to enhanced attack of C4s until all C4s were dissolved. An AES analysis of the TiW patch exhibited strong peaks of Sn and O, indicating the formation and deposition of a tin oxide layer on TiW which prevented removal of the TiW layer.

To develop the etching process of the invention, experimental sample wafers were prepared and etched. The wafers were sputter deposited with Cu 0.43 μm (4300 Å) thick, phased Cr—Cu 0.14 μm (1400 Å) thick and Ti—W 0.10 μm (1000 Å) thick. On top of this, 60–40 solder bumps were deposited by thru mask electroplating.

Figure 1B:
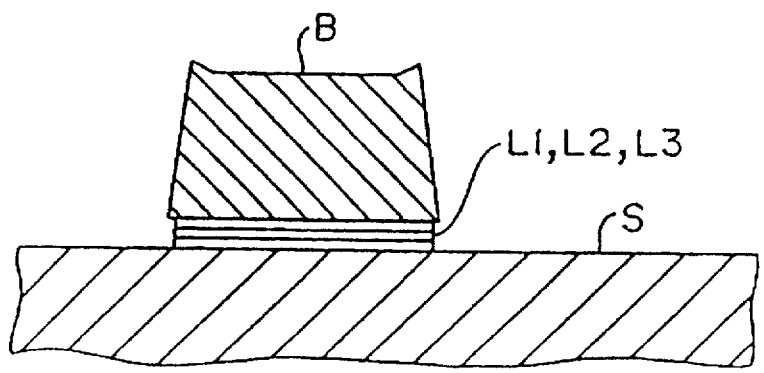
Figure 1C:
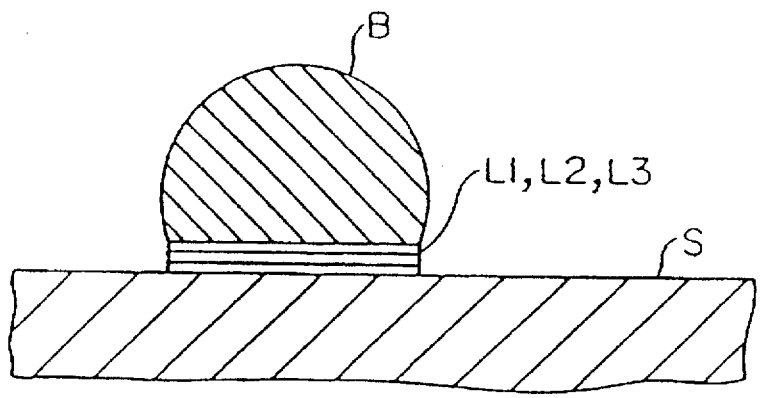

The wafers were electroetched in neutral salt solutions to remove Cu and phased Cr—Cu at potentials high enough that the Ti—W remained passive, and so was not attacked. This step left the TiW/CrCu/Cu seed layer exposed as illustrated in FIG. 1 with L1 being Ti—W, L2 being phased Cr—Cu, and L3 being Cu. Thereafter, the Ti—W was etched in solutions prepared in the course of making the present invention.

The preferred etchant of this invention was discovered to be a mixture of: 10–25 gms EDTA, 15–35 gms $K_2HPO_4$ and 25–45 gms oxalic acid in a liter of 30% $H_2O_2$. The etchant is preferably used at a temperature between 40° C. and 60° C.

A more preferred embodiment of the chemical etching bath consisted of: 15 gms EDTA, 35 gms $K_2HPO_4$, and 35 gms oxalic acid in 1 liter of 30% $H_2O_2$. This bath is preferably operated at about 50° C. which provides an etching rate of about 200 Å (0.02 μm) per minute.

The etchant of the invention does not attack Pb—Sn, Al—Cu, Cu, or phased Cr—Cu. It can be used with dip etching, which allows economical production with a simple throughput cassette-type etching process.

The Ti—W etching process of this invention has been demonstrated in the fabrication of eutectic C4 wafers.

Figure 4:
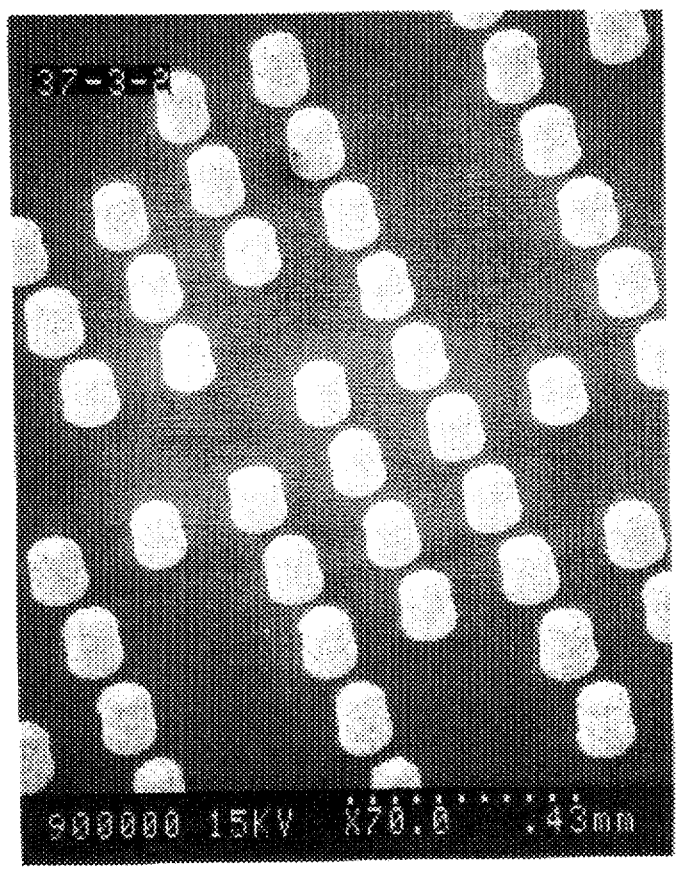
FIG. 4 is a SEM photograph of electrochemically fabricated eutectic C4s after etching with the etchant of the present invention.

As shown in FIG. 4, the method and etchant of the present invention resulted in the complete removal of the TiW layer. Inspection and shear tests of the finished C4 solder bumps indicated that there was no significant Sn—Pb attack and no delamination between the seed layers, the solder bumps, and the substrate.

Subsequent to etching, removal of reaction products that adhere to C4s is essential for obtaining desired reflow characteristics. An oxalic solution in water (1–10% by weight) has been successfully employed to obtain clean C4 surfaces thus providing round and smooth C4s after reflow.

The etching process of this invention is applicable to other seed layers such as TiW/Ni and TiW/Co that are compatible with eutectic C4s.

In general, it is to be understood that the invention includes all variations within the scope of the following claims, and is not limited to the particular examples used to illustrate and describe the invention.

Having thus described our invention what we claim as new and desire to secure as Letters Patent, is:

1. A chemical etchant for etching metals in the presence of one or more metals not to be etched, the etchant comprising:

between 15 and 35 grams $K_2HPO_4$;

between 15 and 35 grms of EDTA; and between 25 and 45 grams of oxalic acid dissolved in a liter of 30% $H_2O_2$.

2. The etchant according to claim 1 wherein said one or more metals not to be etched are selected from the group consisting of tin, lead, aluminum, tin with about 40% lead, aluminum, copper, chromium, chromium-copper, aluminum-copper, cobalt and nickel.

3. The etchant according to claim 1, wherein the etchant is maintained at a temperature between 40° C. and 60° C.

4. The etchant according to claim 2 wherein said Cr—Cu is phased Cr—Cu.

5. A chemical etchant for etching titanium-tungsten alloys in the presence of one or more metals not to be etched, the etchant comprising:

between 15 and 35 grams $K_2HPO_4$;

between 15 and 35 grms of EDTA; and between 25 and 45 grams of oxalic acid dissolved in a liter of 30% $H_2O_2$.

6. The etchant according to claim 5 wherein said one or more metals not to be etched are selected from the group consisting of tin, lead, aluminum, tin with about 40% lead, aluminum, copper, chromium, chromium-copper, aluminum-copper, cobalt and nickel.

7. The etchant according to claim 6 wherein said Cr—Cu is phased Cr—Cu.

8. The etchant according to claim 5, wherein the etchant is maintained at a temperature between 40° C. and 60° C.

9. A method for selectively dissolving, in an article, one or more metals to be dissolved in the presence of one or more metals not to be dissolved, comprising the steps of:

adding between 10 and 25 grams of EDTA plus between 25 and 45 grams oxalic acid plus between 15 to 35 grams $K_2HPO_4$ to 1 liter of 30% $H_2O_2$ to make a solution;

heating the solution to between 40° C. and 60° C.; and wetting the article with said solution so as to dissolve the said one or more metals to be dissolved.

10. The method of claim 9 wherein said one or more metals not to be dissolved are selected from the group comprising Al, Cu, Cr, Al—Cu, Sn, Pb, tin with about 40% lead, Co, Ni, Cr—Cu and phased Cr—Cu.

11. The method of claim 9 further including the step of rinsing said article, after said wetting step, in an aqueous solution consisting essentially of 1–10 weight percent oxalic acid.

* * * * *